(12) United States Patent
Maglica

(10) Patent No.: US 11,384,930 B1
(45) Date of Patent: Jul. 12, 2022

(54) HEAT SINK FOR LIGHTING DEVICES

(71) Applicant: Mag Instrument, Inc., Ontario, CA (US)

(72) Inventor: Anthony Maglica, Ontario, CA (US)

(73) Assignee: MAG INSTRUMENT, INC, Ontario, CA (US)

( * ) Notice: Subject to any disclaimer, the term of this patent is extended or adjusted under 35 U.S.C. 154(b) by 0 days.

(21) Appl. No.: 17/687,398

(22) Filed: Mar. 4, 2022

Related U.S. Application Data

(60) Provisional application No. 63/157,072, filed on Mar. 5, 2021.

(51) Int. Cl.
| | |
|---|---|
| *F21V 29/71* | (2015.01) |
| *F21V 29/85* | (2015.01) |
| *H01L 33/64* | (2010.01) |
| *F21V 29/503* | (2015.01) |
| *F21Y 115/10* | (2016.01) |

(52) U.S. Cl.
CPC ............ *F21V 29/71* (2015.01); *F21V 29/503* (2015.01); *F21V 29/85* (2015.01); *H01L 33/64* (2013.01); *F21Y 2115/10* (2016.08)

(58) Field of Classification Search
CPC ........ F21V 29/71; F21V 29/85; F21V 29/713; F21V 29/502; F21V 29/503; F21Y 2115/10; F12V 29/70; H01L 33/64; H01L 33/48
See application file for complete search history.

(56) References Cited

U.S. PATENT DOCUMENTS

| | | | | |
|---|---|---|---|---|
| 6,517,218 | B2 * | 2/2003 | Hochstein | F21V 29/713 362/800 |
| 7,465,069 | B2 * | 12/2008 | Li | F21V 29/89 362/373 |
| 7,999,278 | B2 * | 8/2011 | Kim | H01L 33/52 257/E33.072 |
| 9,494,308 | B1 * | 11/2016 | Maglica | F21V 23/06 |

* cited by examiner

*Primary Examiner* — Bao Q Truong
(74) *Attorney, Agent, or Firm* — Roy L Anderson

(57) ABSTRACT

A heat sink assembly has a base of non-conductive heat sink material which provides good heat transfer (e.g., aluminum nitride) and two electrical pathways are integrally formed with, and separated by, the base. An LED assembly is thermally and electrically bonded to the top surface of the heat sink assembly.

6 Claims, 6 Drawing Sheets

FIG. 1A 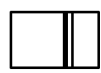  FIG. 1B
FIG. 2A 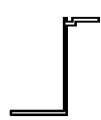 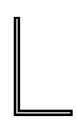 FIG. 2B
 
3      4

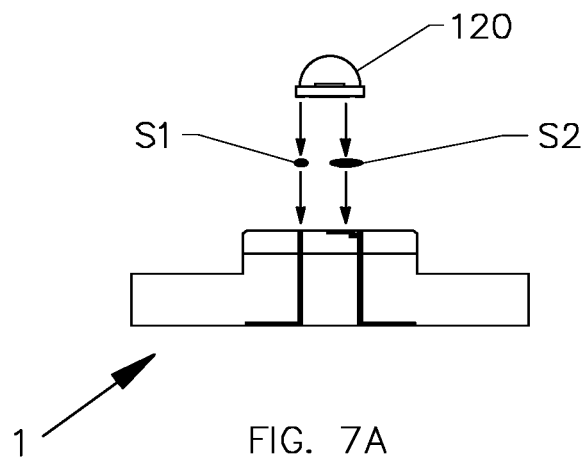
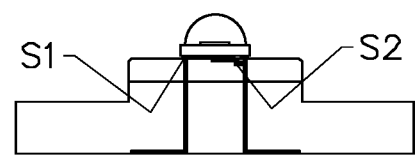
FIG. 7A  FIG. 7B
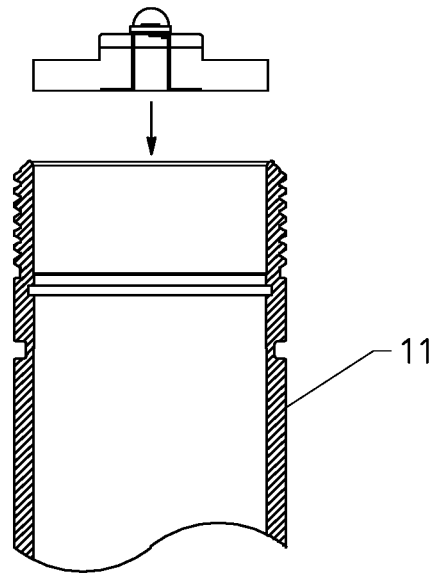
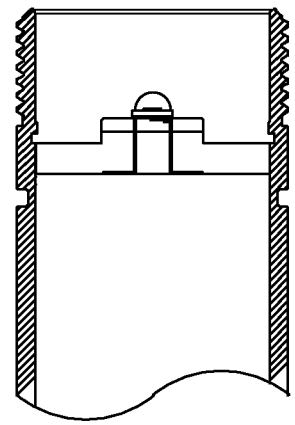
FIG. 7C  FIG. 7D

HEAT SINK FOR LIGHTING DEVICES

CROSS REFERENCE TO RELATED APPLICATIONS

This application is a non-provisional utility application which claims priority from U.S. Ser. No. 63/157,012, filed Mar. 5, 2021, the disclosure of which is specifically incorporated herein by reference in its entirety.

FIELD OF THE INVENTION

The present invention is in the field of lighting devices, and especially flashlights, that use surface mount light emitting diodes (LEDs) as light sources.

BACKGROUND OF THE INVENTION

It is well known that LEDs give off heat during operation and that light output from an LED decreases with increasing LED die junction temperature. Accordingly, there is a well-recognized need for reducing LED die junction temperatures in LED flashlights to increase performance.

The present invention discloses and teaches a much improved LED lighting device, preferably with an outer metallic flashlight housing or barrel, which achieves superior performance through improved heat control of LED die junction temperature via an improved heatsink assembly.

SUMMARY OF THE INVENTION

The present invention is generally directed to a non-conductive heat sink material which provides good heat transfer (e.g., aluminum nitride) configured with positive and negative contacts on its top surface and its bottom surface, such contacts being electrically connected by integrally formed contacts. The resulting structure is configured so that an LED package can be soldered to the top surface contacts and electronics connected to the bottom surface contacts, and such structure is useful in lighting devices, and especially in flashlights. The electrical contacts are integrally formed with the non-conductive heat sink material which electrically separates two electrical paths from the top surface to the bottom surface of a heat sink assembly.

Accordingly, it is a primary object of the present invention to provide improved heatsink technology for use in lighting devices.

This and further objects and advantages will be apparent to those skilled in the art in connection with the drawings and the detailed description of the invention set forth below.

BRIEF DESCRIPTION OF THE DRAWINGS

FIG. 1 is a top view of the assembly, FIG. 2 is a side view of the assembly, and FIG. 3 is a bottom view of the assembly.

FIGS. 1A and 1B are top plan views of the electrical contacts (apart from the assembly itself) while FIGS. 2A and 2B are side cross sectional views of the electrical contacts (also apart from the assembly itself).

FIG. 4 is a top view of the assembly, FIG. 5 is a side view of the assembly, and FIG. 6 is a bottom view of the assembly.

FIGS. 7A-B illustrate a process for manufacturing a heatsink assembly in accordance with the present invention in which solder is used to solder pads of an LED assembly to a top surface of an outer electrically conductive member to form a heatsink assembly while FIGS. 7C-D illustrate a press fit step of inserting a heatsink assembly into a tube or barrel.

DETAILED DESCRIPTION OF THE INVENTION

The present invention is generally applicable to many different types of lighting devices, an especially preferred embodiment of which is flashlights having an outer metallic casing, examples of which are described in U.S. Pat. Nos. 6,361,183 and 8,366,290, the disclosures of which are specifically incorporated by reference herein. Hereinafter, the invention will be illustrated by use of a flashlight without limiting the invention solely to such an embodiment.

Metallic flashlights have been using one or more light emitting diodes ("LEDs") as a light source for a number of years. LEDs can be purchased from a number of suppliers, one example of which is Cree, and for purposes of illustration, Cree® XLamp® XP-G2 LEDs can be used as suitable LEDs.

Figures 8, 8A:
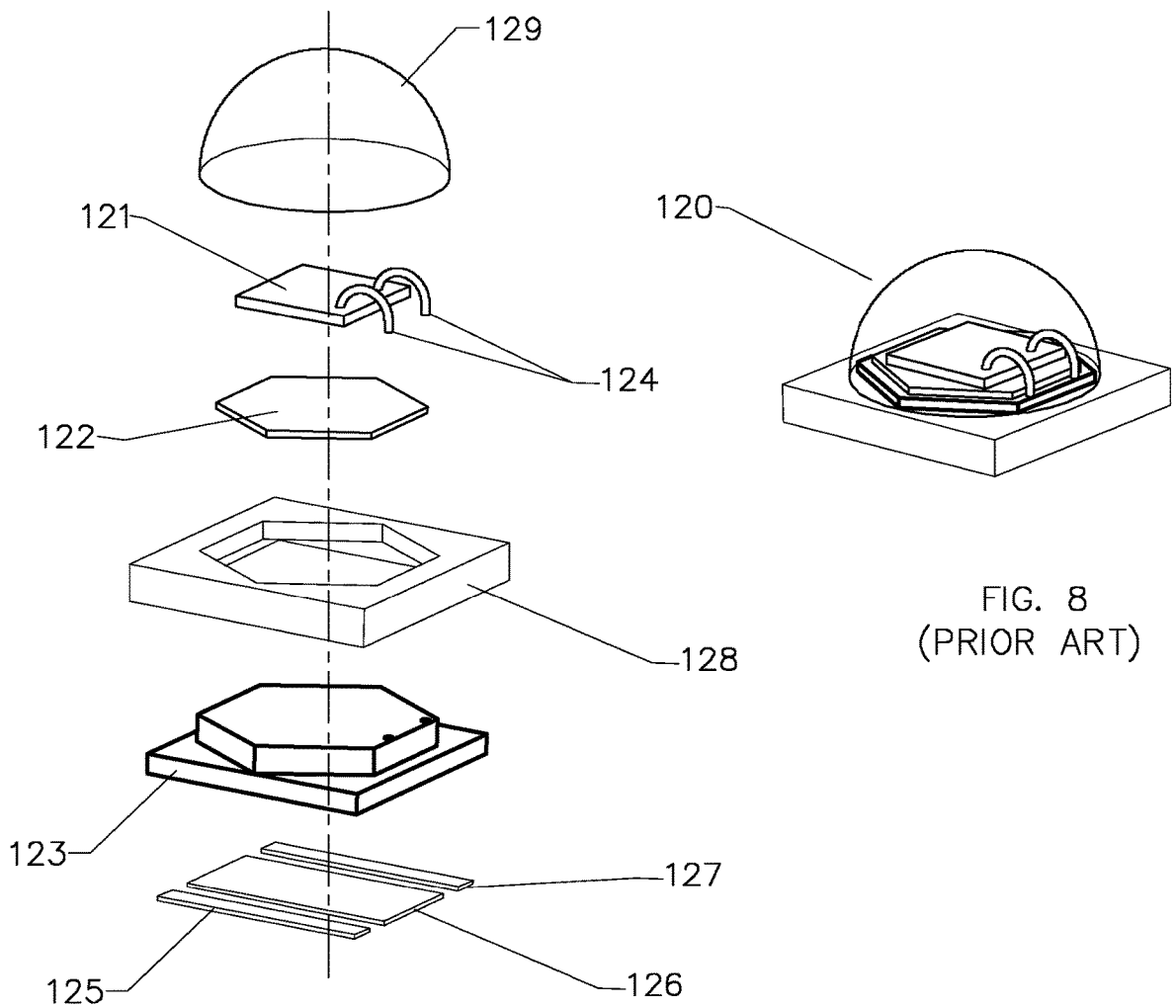
FIG. 8 illustrates a surface mount LED package, such as a Cree® XLamp® XP-G2 LED, which constitutes prior art.
FIG. 8A is an exploded assembly view of FIG. 8.

An LED useful in the present invention is illustrated in FIGS. 8 and 8A, in which an LED package 120 has an LED die 121 located on top of a silicon sub-mount 122 which is located atop a heat conductive material 123 while the bottom of LED package 120 has three surface mount contact pads 125, 126 and 127, heat conductive material 123 being held within an outer casing 128, there being a clear dome 129 placed around and above die 121. One of contact pads 125 and 127 is a positive contact pad, the other is a negative contact pad, while contact pad 126 is neither a negative or positive pad, but a thermal pad which is configured to facilitate transfer of heat from die 121 through heat conductive material 123 outside of LED package 120 via thermal pad 126. The positive and negative contact pads (125, 127) are electrically connected to die 121 via two wire bonds 124. The details of the sub-construction of LED package 120 are not critical to the present invention, and die 121, sub-mount 122 and heat conductive material 123 might be manufactured by a process in which they are integrally formed on a wafer; similarly, the details of how the positive and negative contact pads of LED package 120 are electrically isolated from one another are not critical to the present invention and a variety of different LED package structures might be suitable for use with the present invention, including LED package structures with five or more contact pads. What is important is that there are positive and negative electrically conductive pads to provide power to cause a die within the LED package to emit light and that any heat removal mechanism within the LED package can be thermally connected to an outer electrically conductive member of a heatsink assembly 1 via a thermal pad, as explained below.

A heatsink assembly 1 according to the present invention has a main body 2 which is comprised of a material which is not conductive, but which provides good heat transfer, a non-limiting example of which is aluminum nitride. It should be noted that a material which is not conductive, referenced herein as non-conductive, does not mean that the material has absolutely zero conductivity; instead, it means that any such trace conductivity, as is the case with aluminum nitride, is so low that the material functions as electrical insulation rather than as an electrical conductor. For purposes of the present invention, a material which is non-conductive may have some Body 2 has a top surface with top surface negative contact 3T and top surface positive contact 4T and a bottom surface with bottom surface negative contact 3B and bottom surface positive contact 4B. Top surface negative contact 3T is electrically connected with bottom surface negative contact 3B by negative connector 3V while top surface positive contact 4T is electrically connected with bottom surface negative contact 4B by positive connector 4V. In especially preferred embodiments connectors 3V and 4V are formed inside of holes in body 2, but connectors 3V and 4V may be configured, in alternative embodiments, to run along the top and bottom surfaces of body 2 and then travel along sides of body 2 between said top and bottom surfaces. Top surface contacts 3T and 4T are configured to be soldered to contact pads 125, 126 and 127; as illustrated in FIG. 1A, top surface contact 3T is configured to be soldered to two contact pads while top surface contact 4T is configured to only be soldered to one contact pad, but this could easily be reversed in an alternative embodiment. Bottom surface contacts 3B and 4B can be configured with any desired shape that is conducive to making desired electrical contacts with other components of a lighting device, and their size and shape is not critical to the present invention.

Figure 1:
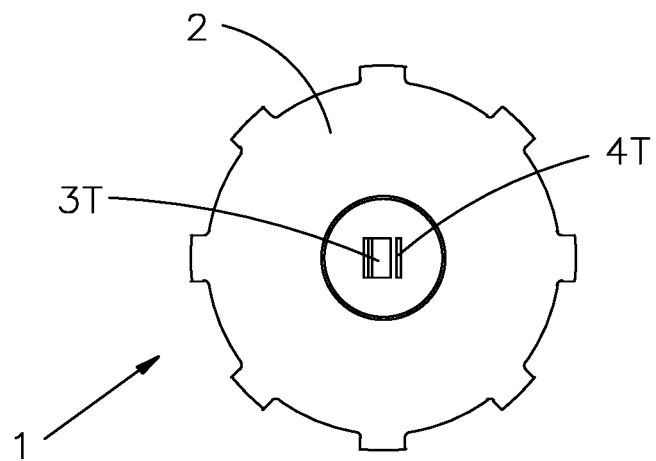
FIGS. 1-3 illustrate a heatsink assembly in accordance with the present invention in which electrical contacts are fused together with the heatsink material.
Figure 2:
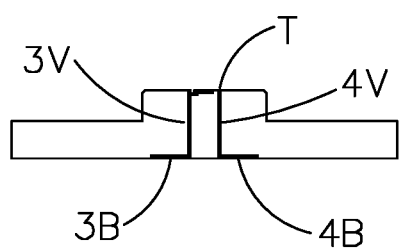
Figure 3:
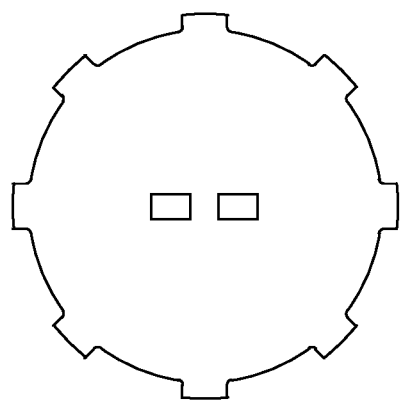

FIGS. 1-3 illustrate an especially preferred embodiment of a heatsink assembly 1 in which conductive components 3T, 3V and 3B, and conductive components 4T, 4V and 4B, have been fused together by heating so that they are integrally formed with aluminum nitride body 2 into a single, solidary component, in a process somewhat resembling making of glass. The resultant heatsink assembly 1 has a unitary structure with two separate conductive pathways from its top surface to its bottom surface which are electrically separated by the aluminum nitride of body 2.

Figure 4:
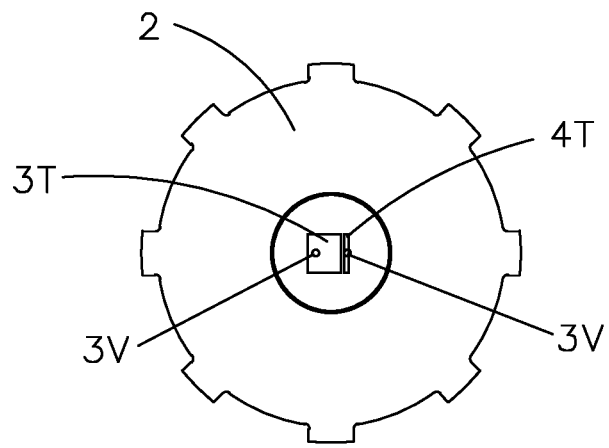
FIGS. 4-6 illustrate another heatsink assembly in accordance with the present invention in which electrical contacts are printed onto the heatsink material and electrical contacts are formed inside of vias in the heatsink material.
Figure 5:
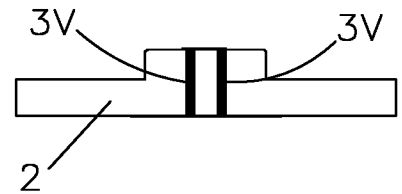
Figure 6:
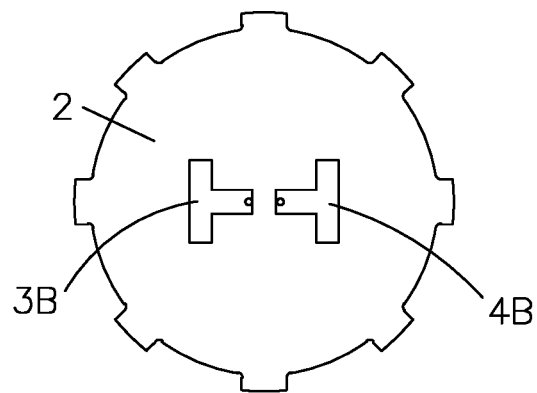

FIGS. 4-6 illustrate an alternative especially preferred embodiment of a heatsink assembly 1 in which conductive components 3T, 3B, 4T and 4B have been printed onto aluminum nitride body 2 while conductive connector components 3V and 4B are plated into holes formed in aluminum nitride body 2.

Body 2 serves as the heatsink component of heatsink assembly 1 and its top surface provides a mounting surface for LED package 120. The anode or cathode contact pad of LED package 120, as well as a dedicated thermal pad (e.g., 126 of FIG. 8A), are bonded to top surface contacts 3T and 3B by soldering or some other thermally and electrically conductive method or material. LED package 120 is thermally and electrically connected to heatsink assembly 1 so that LED package 120 is turned on when power from an electrical circuit is applied to bottom surface contacts 3B and 4B. Heat generated by LED die 121 is conducted through sub-mount 122 to heat conductive material 123 to thermal pad 126 and pads 125, 127 where it is conducted to body 2 and then can be conducted to a lighting device structure, such as barrel 11, and then finally to ambient air. LED package 120 runs much cooler and more efficiently in this system than is possible when LED package 120 is mounted on printed circuit boards because of lower thermal resistance of the system.

Figure 7E:
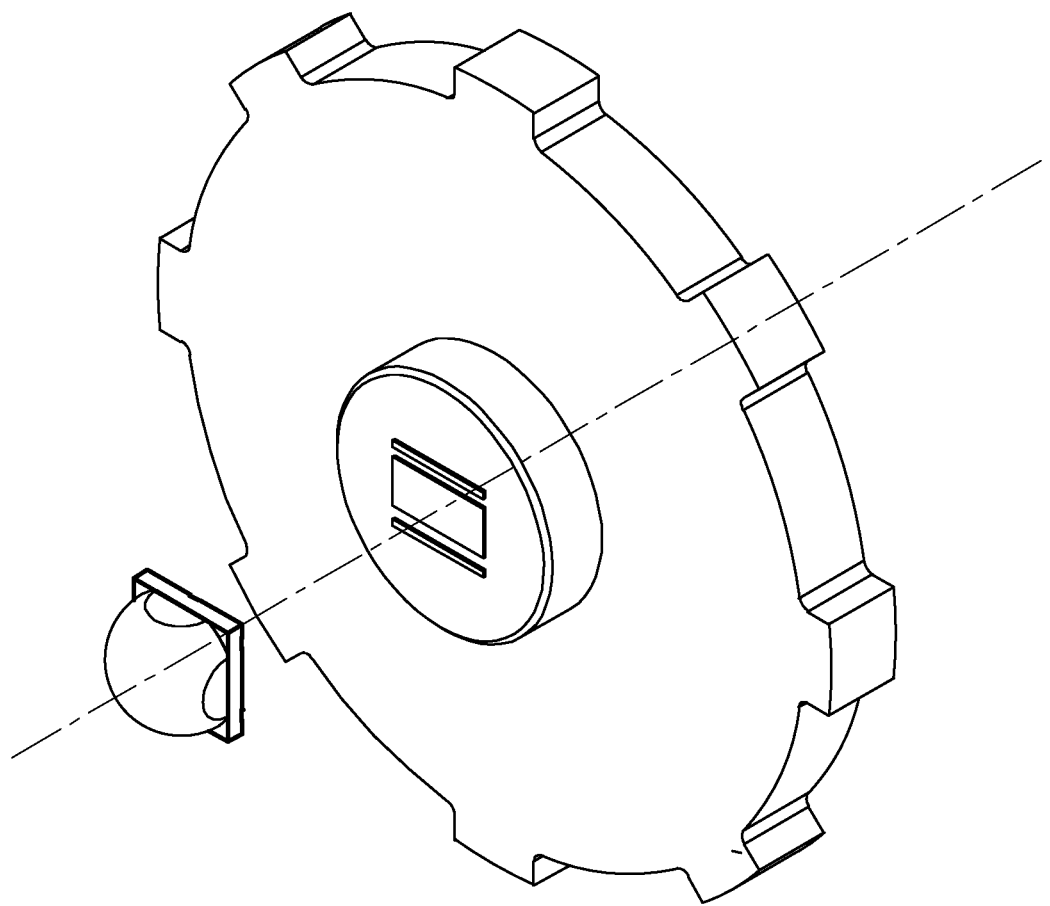
FIG. 7E is an enlarged side perspective view illustrating how the LED assembly is mounted to the top surface of a heatsink assembly in accordance with the present invention.

Once heatsink assembly 1 is created, it can be press fit into a tube or barrel 11 as illustrated in FIGS. 7C and 7D or it can be removably inserted into tube or barrel 11 and then be held in place by a removable holding mechanism.

While the invention has been described herein with reference to certain preferred embodiments, those embodiments have been presented by way of example only, and not to limit the scope of the invention. Additional embodiments will be obvious to those skilled in the art having the benefit of this detailed description.

Accordingly, still further changes and modifications in the actual concepts descried herein can readily be made without departing from the spirit and scope of the disclosed inventions as defined by the following claims.

What is claimed is:

1. An apparatus, comprising:
  a heatsink assembly comprising:
    a non-conductive base which is thermally conductive configured with two separate electrically conductive pathways from a top surface of the non-conductive base to a bottom surface of the non-conductive base, said two separate electrically conductive pathways being electrically isolated from each other comprising:
      a negative pathway comprised of a top surface negative contact located at the top surface, a bottom surface negative contact located at the bottom surface, and a negative connector which electrically connects the top surface negative contact with the bottom surface negative contact; and
      a positive pathway comprised of a top surface positive contact located at the top surface, a bottom surface positive contact located at the bottom surface, and a positive connector which electrically connects the top surface positive contact with the bottom surface positive contact; and
  a light emitting emitting diode ("LED") packaged mounted to the heatsink assembly, said LED package comprising:
    a substrate;
    an LED die held by the substrate, said LED die configured to emit light outwardly from a front surface of the LED package;
    a first electrically conductive pad;
    a second electrically conductive pad; and
    a thermal pad configured for removing heat from the LED die to outside of the LED package;
    wherein the first and second electrically conductive pads are configured to provide power to cause the LED die to emit light; and
    wherein the first and second electrically conductive pads and the thermal pad are located on a rear surface of the LED package opposite from the LED die;
  wherein each of the first and second electrically conductive pads are thermally and electrically bonded to one of the top surface negative and positive contacts and the thermal pad is thermally bonded to one of the top surface negative and positive contacts; and
  wherein the LED die emits light when power from an electrical circuit is applied to the bottom negative and positive contacts.

2. The apparatus of claim 1, wherein the non-conductive base is integrally formed with said two separate electrically conductive pathways.

3. The apparatus of claim 2, wherein the negative pathway is fused together into a unitary negative pathway and the positive pathway is fused together into a unitary positive pathway.

4. The apparatus of claim 3, wherein the unitary negative pathway and the unitary positive pathway are fused together with the non-conductive base.

5. The apparatus of claim 4, wherein the non-conductive base is comprised of aluminum nitride.

6. The apparatus of claim 2, wherein the top surface negative and positive contacts are printed onto the top surface of the non-conductive base and the bottom surface negative and positive contacts are printed onto the bottom surface of the non-conductive base.

\* \* \* \* \*